United States Patent [19]

Okajima

[11] Patent Number: 5,550,838
[45] Date of Patent: Aug. 27, 1996

[54] METHOD FOR TESTING CHARACTERISTICS OF A SEMICONDUCTOR MEMORY DEVICE IN A SERIES OF STEPS

[75] Inventor: Susumu Okajima, Kyoto, Japan

[73] Assignee: Rohm Co., Ltd., Kyoto, Japan

[21] Appl. No.: 156,392

[22] Filed: Nov. 22, 1993

Related U.S. Application Data

[63] Continuation of Ser. No. 889,444, May 27, 1992, abandoned.

[30] Foreign Application Priority Data

Aug. 7, 1991 [JP] Japan .................... 3-223422

[51] Int. Cl.⁶ ...................... G01R 31/28; G01R 31/22
[52] U.S. Cl. .................................................... 371/21.2
[58] Field of Search ............................ 371/21.1, 21.4, 371/28, 21.2; 324/73.1, 158 R, 158 T

[56] References Cited

U.S. PATENT DOCUMENTS

| | | | |
|---|---|---|---|
| 4,363,407 | 12/1982 | Bucker et al. | 324/73.1 |
| 4,651,088 | 8/1987 | Sawada | 324/73 R |
| 4,727,318 | 2/1988 | Sakai et al. | 324/158 R |
| 5,053,698 | 10/1991 | Ueda | 324/73.1 |
| 5,062,109 | 10/1991 | Ohshima et al. | 371/21.2 |

FOREIGN PATENT DOCUMENTS 2-235374  9/1990  Japan .................... 371/21.1

*Primary Examiner*—Hoa T. Nguyen
*Attorney, Agent, or Firm*—Brumbaugh, Graves, Donohue & Raymond

[57] ABSTRACT

Transfer data indicating a measurement status of a characteristics test of a semiconductor memory device is written into the semiconductor memory device itself in any one of a series of measurement steps. In the immediately following measurement step, the transfer data is read out, before performance of a characteristics test of this step, to judge the measurement status of the preceding measurement step. For example, the transfer data is data indicating that the characteristics test has been performed in the preceding step. Alternatively, it is classification data indicating a rank of the semiconductor memory device.

3 Claims, 3 Drawing Sheets

METHOD FOR TESTING CHARACTERISTICS OF A SEMICONDUCTOR MEMORY DEVICE IN A SERIES OF STEPS

This application is a continuation of application Ser. No. 07/899,444, filed on May 27, 1992, now abandoned.

BACKGROUND OF THE INVENTION

The present invention relates to a testing method of semiconductor memory devices such as an EEPROM (electrically erasable programmable ROM) and an EPROM (erasable programmable ROM).

In a conventional semiconductor manufacturing process, a group of packaged semiconductor memory devices are provided to a series of measurement steps to test their various electrical characteristics, in which the tests of the respective measurement steps are performed independently. For example, as shown in FIG. 4, a group of semiconductor memory devices is first input to measurement step 1, where their electrical characteristics (e.g., a response speed) under a high-temperature condition are evaluated to sort those devices. That is, in the measurement step 1, the semiconductor memory devices are sorted into, for instance, rank A, rank B and rank C in the order of superiority of the electrical characteristics. The semiconductor memory devices of ranks A–C are then input to respective measurement steps 2, where electrical characteristics under the normal temperature condition are evaluated to again sort the semiconductor memory devices into ranks A–C based on the evaluation results. The devices sorted in this manner are finally shipped.

However, this conventional testing method has the following problems.

As described above, the respective tests of the series of measurement steps are performed independently. Therefore, even if semiconductor devices of one measurement lot are erroneously input to the measurement step 2 skipping the measurement step 1, their electrical characteristics are tested in the measurement step 2 in the same manner as in the case of the normal flow. As a result, a semiconductor device that should be shipped as a rank C device because of its inferior electrical characteristics under the high-temperature condition may be shipped erroneously as a rank B device because of its average electrical characteristics under the normal temperature condition. Since an operation slip is attached to each group of semiconductor memory devices which is going through the measurement steps, an operator can find such erroneous skipping of some measurement step by checking the operation slip. However, even if a procedure is established in which operators are obliged to check the slips, there still exists a possibility that they inadvertently fail to find the erroneous skipping of an measurement step.

Further, in the conventional testing method, since a group of semiconductor memory devices is divided in the measurement step 1 into a plurality of groups, the number of groups (lots) going through the process are increased, so that the process management will become intricate as much.

Further, a handling machine (i.e., a measurement handler) for handling the semiconductor memory devices in the measurement step 1 needs to be equipped with is a sorting mechanism, which a factor of making the construction of the handling machine complex.

SUMMARY OF THE INVENTION

The present invention has been made in view of the above problems in the art, and has an object of providing a semiconductor memory device testing method which can detect erroneous skipping of a measurement step easily in a positive manner.

Another object of the invention is to provide a semiconductor memory device testing method which can obviate complication of measurement process management due to repeated division of semiconductor memory devices of one lot, and which can simplify the construction of a measurement handler.

According to the invention, a method of testing characteristics of a semiconductor memory device in a series of measurement steps comprises the steps of:

writing, in a first measurement step that is any one of the series of measurement steps, transfer data related to a characteristics test of the first measurement step into a semiconductor memory device that has been subjected to the characteristics test; and reading, in a second measurement step that immediately follows the first measurement step, the transfer data stored in the semiconductor memory device before performing a characteristics test of the second measurement step, and judging a status of the first measurement step based on the readout transfer data.

Typical transfer data is classification data indicating a rank of the semiconductor memory device which is determined in accordance with results of the characteristics test.

DESCRIPTION OF THE PREFERRED EMBODIMENT

An embodiment of the present invention is described hereinafter with reference to the accompanying drawings.

Figure 1:
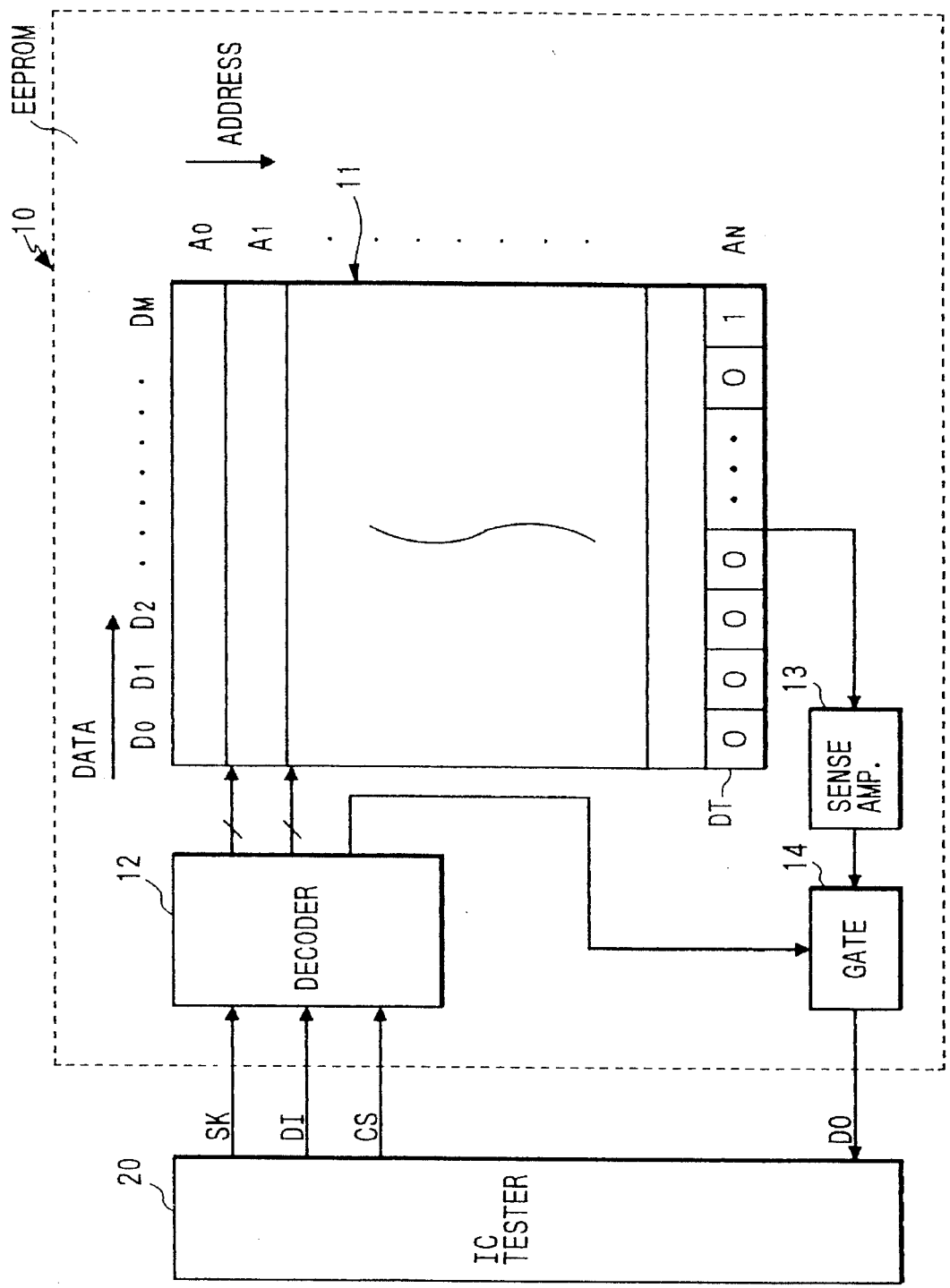
FIG. 1 is a block diagram showing a connection between an IC tester and an EEPROM to be tested.

FIG. 1 is a schematic block diagram showing a connection between an EEPROM 10 as an example of an object to be tested and an IC tester 20 for testing its electrical characteristics.

The EEPROM 10 is of a serial data input type, and includes memory cells 11, a decoder 12, a sense amplifier 13, a gate 14 and other components. In order to evaluate the characteristics of the EEPROM 10, the IC tester 20 inputs to it a chip selection signal CS, serial data DI, a serial clock SK, and other signals. As is well known in the art, the chip selection signal CS is used to activate the EEPROM 10. The serial data DI includes an operation mode code for specifying a read or write operation, address data for indicating an address of the memory cells 11, writing data (in the case of the write operation), and other data. The serial clock SK is a sync signal in the data read/write operation. Symbol DO in FIG. 1 represents data read from the EEPROM 10. Although the embodiment is described with the EEPROM 10 of the serial data input type, it is apparent that the invention can also be applied to EEPROMs of a parallel data input type.

Figure 2:
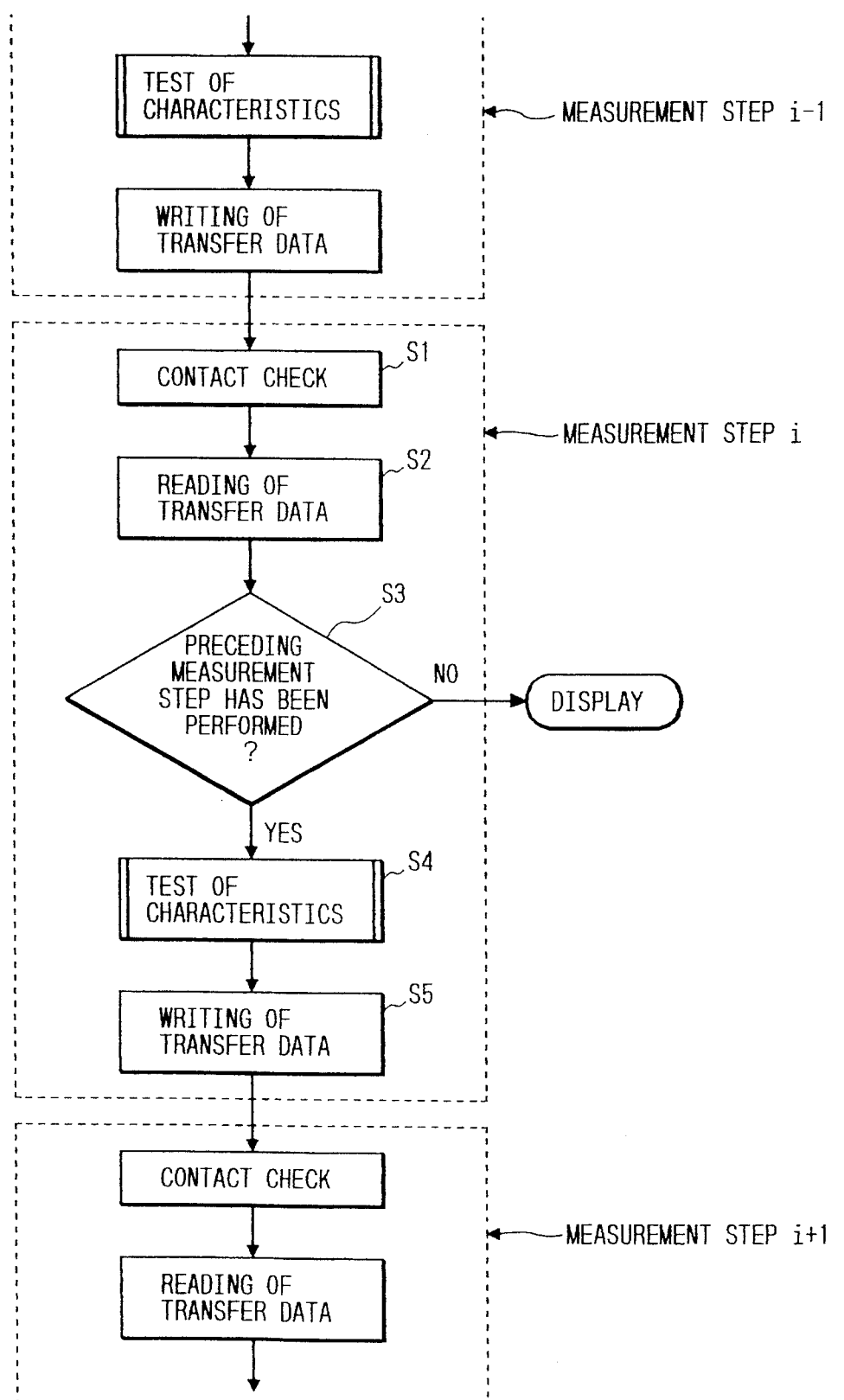
FIG. 2 is a flowchart showing a testing method according to an embodiment of the invention.

Referring to a flowchart of FIG. 2, a testing method according to the embodiment is described.

FIG. 2 describes the whole measurement step i (representative step) and part of measurement steps i−1 and i+1 that before and after the step i, respectively. In the measurement step i−1 (i.e., a preceding measurement step with respect to the measurement step i), after performance of a test of characteristics specific to that step, transfer data DT to be transferred to the next measurement step i is written into the memory cells 11 of the EEPROM 10, that has been subjected to the test, at a predetermined address ($A_N$ in FIG. 1). This is done by setting, in the serial data DI to be output from the IC tester 20, the write code, address data indicating the address $A_N$ where the transfer data is to be written, and the transfer data of a predetermined kind.

Although no specific limitations are imposed on the particulars of the transfer data DT, the contents of the transfer data are briefly exemplified as follows. In the case of only indicating the completion of the characteristics test of the measurement step i−1, it suffices that, for instance, data "1" is set as the transfer data (it is assumed that initial data of all the memory cells 11 is "0"). On the other hand, if it is intended to classify the semiconductor memory devices into ranks A, B and C in accordance with the evaluation results of their characteristics, the transfer data DT may be prepared such that data "1", "2" and "3" are assigned to ranks A, B and C, respectively.

After completion of the characteristics test of the measurement step i−1, the group of EEPROMs 10 is provided to the measurement step i (i.e., a following measurement step with respect to the measurement step i−1). The following operation is performed in the measurement step i.

Step S1: A contact check is performed in which it is checked whether measurement terminals of the measurement handler are in correct electrical contact with the terminals of the EEPROM 10 that is an object to be measured. This type of contact test is performed in each measurement step.

Step S2: The transfer data DT stored in the EEPROM 10 is read out. This is done by setting, in the serial data DI to be output from the IC tester 20, the read code and the address data indicating the address $A_N$ of the area where the transfer data DT is stored. The transfer data DT read from the memory cells 11 is provided to the IC tester 20 via the sense amplifier 13 and gate 14.

Step S3: Based on the transfer data DT provided to the IC tester 20, it is judged whether the characteristics test of the preceding measurement step i−1 has been performed. More specifically, if the transfer data DT is not of the predetermined kind, it is judged that the test of the preceding measurement step i−1 has not been performed, and the operator is notified of this judgment result, for instance, by some indication on a display device.

Step S4: On the other hand, if the transfer data DT, that has been transferred from the preceding measurement step i−1, is of the predetermined kind, the characteristics test specific to the measurement step i is performed.

Step S5: New transfer data DT is prepared in accordance with the results of the characteristics test, and is overwritten into the memory cells 11 at the address $A_N$, in the manner similar to the above. The new transfer data may be such data that reflects both results of the characteristics tests of the measurement steps i−1 and i.

Thus, the operation of the measurement step i is completed. The group of EEPROMs 10 is then provided to the next measurement step i+1, where similar operation is performed. If the measurement step i+1 is the last measurement step, the new transfer data DT is not written into the memory cells 11 but the previous transfer data DT stored in the memory cells 11 is erased.

Figure 3:
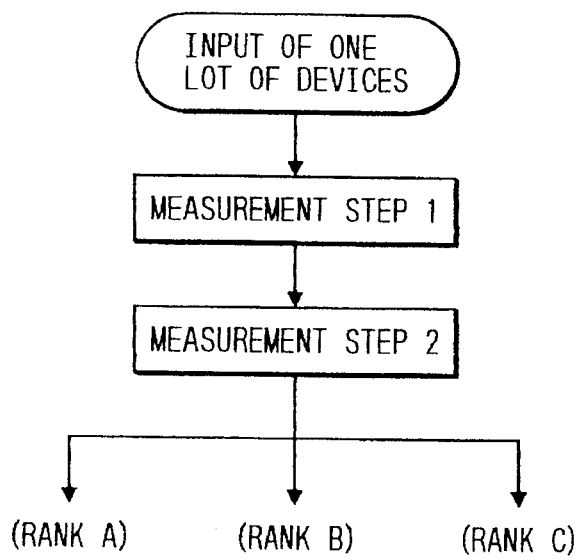
FIG. 3 shows a flow of semiconductor memory devices of one lot when the testing method of FIG. 2 is applied to a series of measurement steps.
Figure 4:
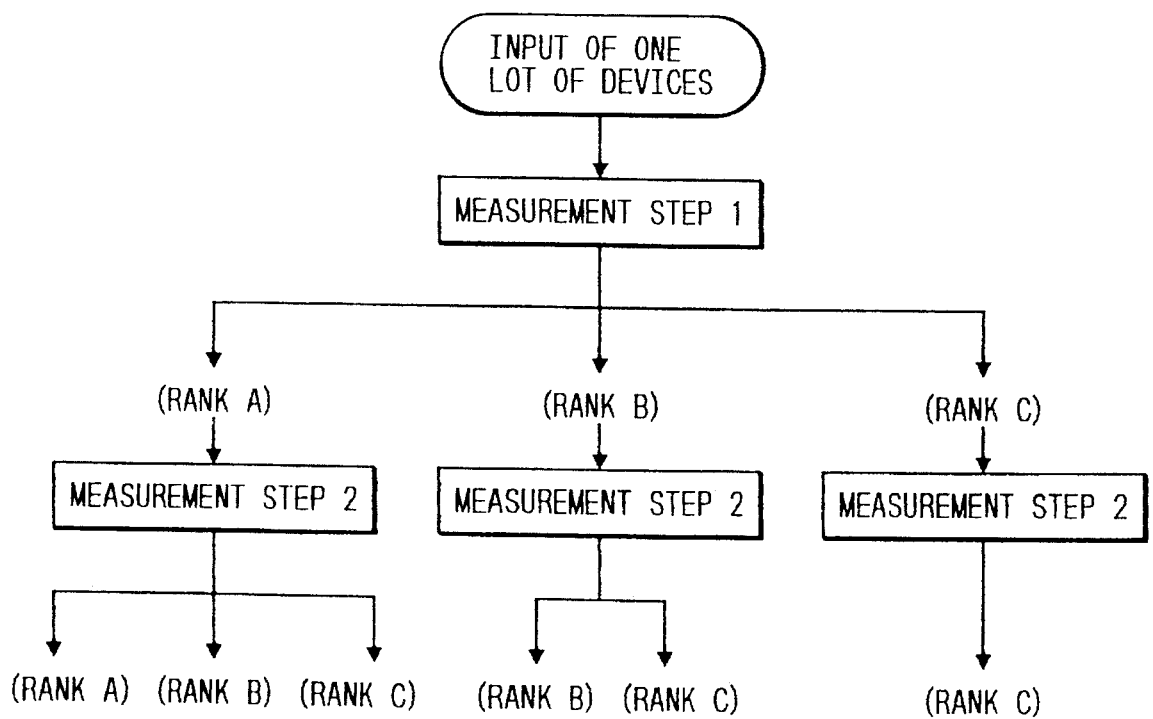
FIG. 4 shows a flow of semiconductor memory devices of one lot in the case of a conventional testing method.

FIG. 3 shows a flow of measurement steps for semiconductor memory devices according to the invention, which corresponds to the conventional flow of FIG. 4.

As described above, in measurement step 1, rank classification data as the transfer data to measurement step 2 can be written into a semiconductor memory device (EEPROM in the above embodiment). Therefore, a group of semiconductor memory devices is provided from the measurement step 1 to the measurement step 2 without being divided. In the last measurement step 2, the semiconductor memory devices belonging to the group are classified into ranks A, B and C based on the transfer data (rank classification data) stored in the respective semiconductor memory devices and results (rank classification data) of the characteristics test of the measurement step 2. Comparing the flows of FIGS. 3 and 4, it is understood that according to the embodiment the number of times of dividing the semiconductor memory devices of the measurement lot in a series of measurement steps is reduced and, as a result, the process management can be made easier.

Further, it suffices that a measurement handler of the measurement step 1 has a function of sorting only two kinds of classes, i.e., non-defective products of ranks A–C and defective products that are classified into none of ranks A–C. Therefore, the construction of the measurement handler of the measurement step 1 can be simplified as much.

Although in the above embodiment the EEPROM is employed as an example of the semiconductor memory device to be measured, the invention can also be applied to other types of semiconductor memory devices such as an EPROM and an IC card.

The transfer data to the following measurement step is not limited to the data indicating the completion of the measurement and the rank classification data that are described in the above embodiment, but may include a measurement date and time and a lot number.

As is apparent from the foregoing description, according to the invention, in the preceding measurement step the data to be transferred to the following measurement step is written into a semiconductor memory device after its characteristics test. In the following measurement step, the transfer data is read from the semiconductor device before its characteristics test, and the measurement status of the preceding measurement step is judged. Therefore, erroneous skipping of the preceding measurement step can be detected automatically. Compared to the conventional method in which operators are obliged to find the erroneous skipping by checking operation slips, the erroneous skipping of a measurement step can be detected easily in a positive manner.

Further, where the rank classification data indicating the evaluation results of the characteristics of the semiconductor memory device is used as the transfer data, the number of times of dividing the semiconductor memory devices of a measurement lot in a series of measurement steps is reduced, which contributes to facilitating the process management. Further, the construction of the measurement handler can be simplified.

What is claimed is:

1. A method of testing a semiconductor memory device classifiable into one of a plurality of classifications and having an erasable memory comprising the steps of:

performing a first measurement on the semiconductor memory device, including:
  conducting a first test on the semiconductor device;
  recording in the erasable memory of the semiconductor device being tested transfer data relating to the result of the first test;
performing immediately after the first measurement a second measurement on the semiconductor memory device, including:
  reading the transfer data recorded in the erasable memory to determine if the first measurement has been performed by determining whether the read-out transfer data is of a predetermined kind;
  if the read-out transfer data is of the predetermined kind, conducting a second test on the semiconductor memory device;
  classifying the semiconductor memory device into one of a plurality of classifications based on the transfer data read-out in the reading step and based on the result of the second test; and
erasing the data recorded in the erasable memory.

2. A method according to claim 1, wherein the transfer data includes data for determining whether the first measurement has been performed.

3. A method according to claim 1, wherein the transfer data includes data for determining a classification status of the semiconductor memory device.

* * * * *